United States Patent
Yamada et al.

(10) Patent No.: US 7,561,080 B2
(45) Date of Patent: Jul. 14, 2009

(54) SEMICONDUCTOR INTEGRATED CIRCUIT

(75) Inventors: Naoki Yamada, Osaka (JP); Naoki Kuroda, Kyoto (JP)

(73) Assignee: Panasonic Corporation, Osaka (JP)

( * ) Notice: Subject to any disclaimer, the term of this patent is extended or adjusted under 35 U.S.C. 154(b) by 122 days.

(21) Appl. No.: 11/790,737

(22) Filed: Apr. 27, 2007

(65) Prior Publication Data
US 2008/0169950 A1  Jul. 17, 2008

(30) Foreign Application Priority Data
Apr. 27, 2006  (JP) .............................. 2006-123563

(51) Int. Cl.
*H03M 9/00* (2006.01)
(52) U.S. Cl. ...................... 341/100; 341/101
(58) Field of Classification Search .................. 341/100; 326/47, 41, 101
See application file for complete search history.

(56) References Cited

U.S. PATENT DOCUMENTS 6,218,860 B1 * 4/2001 Lytle et al. .................... 326/41
6,873,185 B2 * 3/2005 Cox ............................. 326/47
2004/0188853 A1   9/2004 Motomochi

FOREIGN PATENT DOCUMENTS

JP          01-195379           8/1989

* cited by examiner

*Primary Examiner*—Rexford N Barnie
*Assistant Examiner*—Joseph Lauture
(74) *Attorney, Agent, or Firm*—McDermott Will & Emery LLP

(57) ABSTRACT

The semiconductor integrated circuit includes: a plurality of macro cells; and a serial-parallel conversion circuit for converting a serial signal inputted from outside to generate parallel selection control signals during testing, or an A/D conversion circuit for converting an analog signal inputted from outside to generate digital selection control signals during testing. One or more among, the plurality of macro cells are selected based on the selection control signals and brought to a test operation state.

8 Claims, 13 Drawing Sheets

SEMICONDUCTOR INTEGRATED CIRCUIT

BACKGROUND OF THE INVENTION

1. Field of the Invention

The present invention relates to a semiconductor integrated circuit having a plurality of macro cells on the same chip, and more particularly, to a semiconductor integrated circuit permitting selective testing of such macro cells.

2. Description of the Prior Art

In a semiconductor integrated circuit having a plurality of macro cells on the same chip, testing such as operation verification is sometimes required for each macro cell. As a semiconductor integrated circuit permitting such testing, known is one that receives a predetermined coded selection signal externally, decodes the signal internally and selectively brings each macro cell to a test operation state based on the decoded signal (see Japanese Laid-Open Patent Publication No. 1-195379, for example).

In receiving a selection signal from outside the semiconductor integrated circuit as described above, when one macro cell is to be selected among a total of the n-th power of 2 macro cells, for example, at least n external signal input terminals will be necessary. If two or more macro cells are to be made selectable simultaneously, a further larger number of terminals will be necessary.

The conventional semiconductor integrated circuit therefore has a problem that neither reduction in the number of terminals nor enhancement in flexibility of testing is available.

SUMMARY OF THE INVENTION

An object of the present invention is providing a semiconductor integrated circuit capable of flexibly selecting macro cells with a reduced number of terminals for testing and the like.

The semiconductor integrated circuit of the present invention includes: a plurality of macro cells; and a serial-parallel conversion circuit for parallel-converting a serial signal inputted from outside to generate parallel selection control signals during testing, or an A/D conversion circuit for A/D-converting an analog signal inputted from outside to generate digital selection control signals during testing, wherein one or more among the plurality of macro cells are selected based on the selection control signals and brought to a test operation state.

With the above configuration, one or more among a plurality of macro cells can be selected in various combinations based on a serial signal or an analog signal inputted via a reduced number of terminals.

DESCRIPTION OF THE PREFERRED EMBODIMENTS

Figure 1:
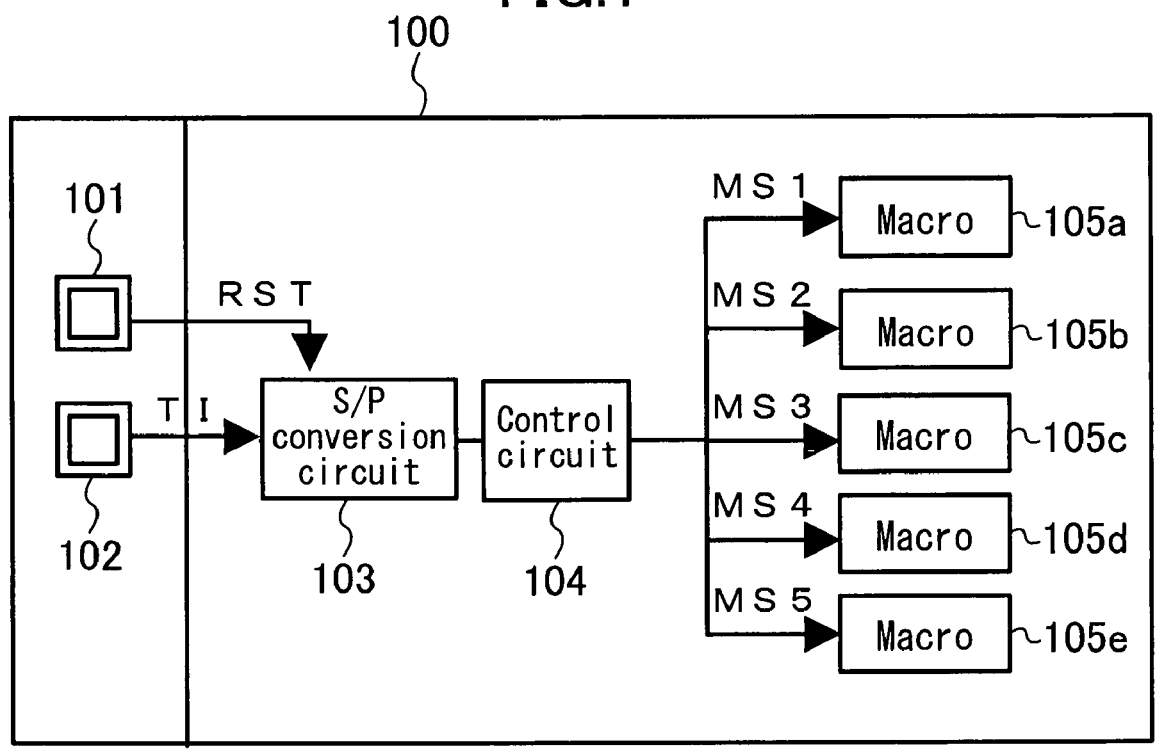
FIG. 1 is a block diagram of a main portion of a semiconductor integrated circuit of Embodiment 1.

Hereinafter, preferred embodiments of the present invention will be described with reference to the accompanying drawings. Note that in the embodiments to follow, components having substantially the same functions as those in any previous embodiment are denoted by the same reference numerals, and the description thereof is omitted.

Embodiment 1

FIG. 1 is a block diagram showing a main portion of a semiconductor integrated circuit 100 formed in one chip. The semiconductor integrated circuit 100 includes a reset terminal 101, a test terminal 102, a serial-parallel conversion circuit 103, a control circuit 104 and a plurality of (for example, five) macros 105a to 105e. The macros 105a to 105e constitute a memory although not specifically limited.

The serial-parallel conversion circuit 103 receives a reset signal RST from the reset terminal 101 and a serial selection control signal TI (input test signal) from the test terminal 102.

Figure 2:
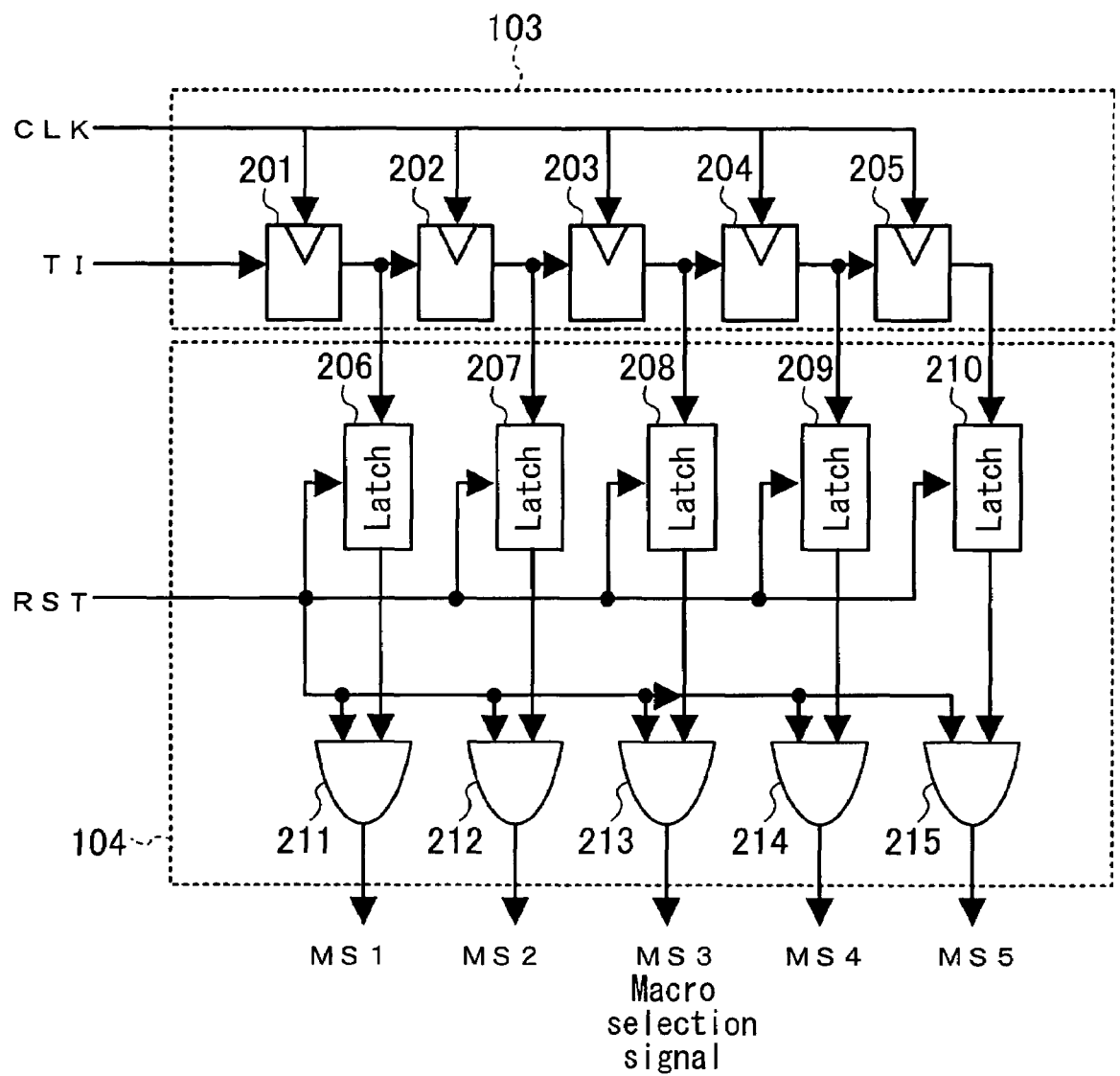
FIG. 2 is a circuit diagram showing a specific configuration of a serial-parallel conversion circuit in Embodiment 1.

As shown in FIG. 2, for example, the serial-parallel conversion circuit 103 has serially connected D flipflops 201 to 205, and converts the serial selection control signal TI to parallel selection control signals in synchronization with a clock signal CLK received from outside (or generated inside) the semiconductor integrated circuit 100.

The control circuit 104, which is also shown in FIG. 2, has latches 206 to 210 and AND circuits 211 to 215. The latches 206 to 210 latch their last received signals during the time when the reset signal RST is in a high (H) level. The AND circuits 211 to 215 respectively output the signals outputted from the latches 206 to 210 to the macros 105a to 105e as macro selection signals MS1 to MS5 during the time when the reset signal RST is in H level.

The macros 105a to 105e are brought to a test operation state when the corresponding macro selection signals MS1 to MS5 are in H level, for example, permitting the macros to perform a predetermined operation individually.

Hereinafter, a specific example of operation will be described.

Figure 3:
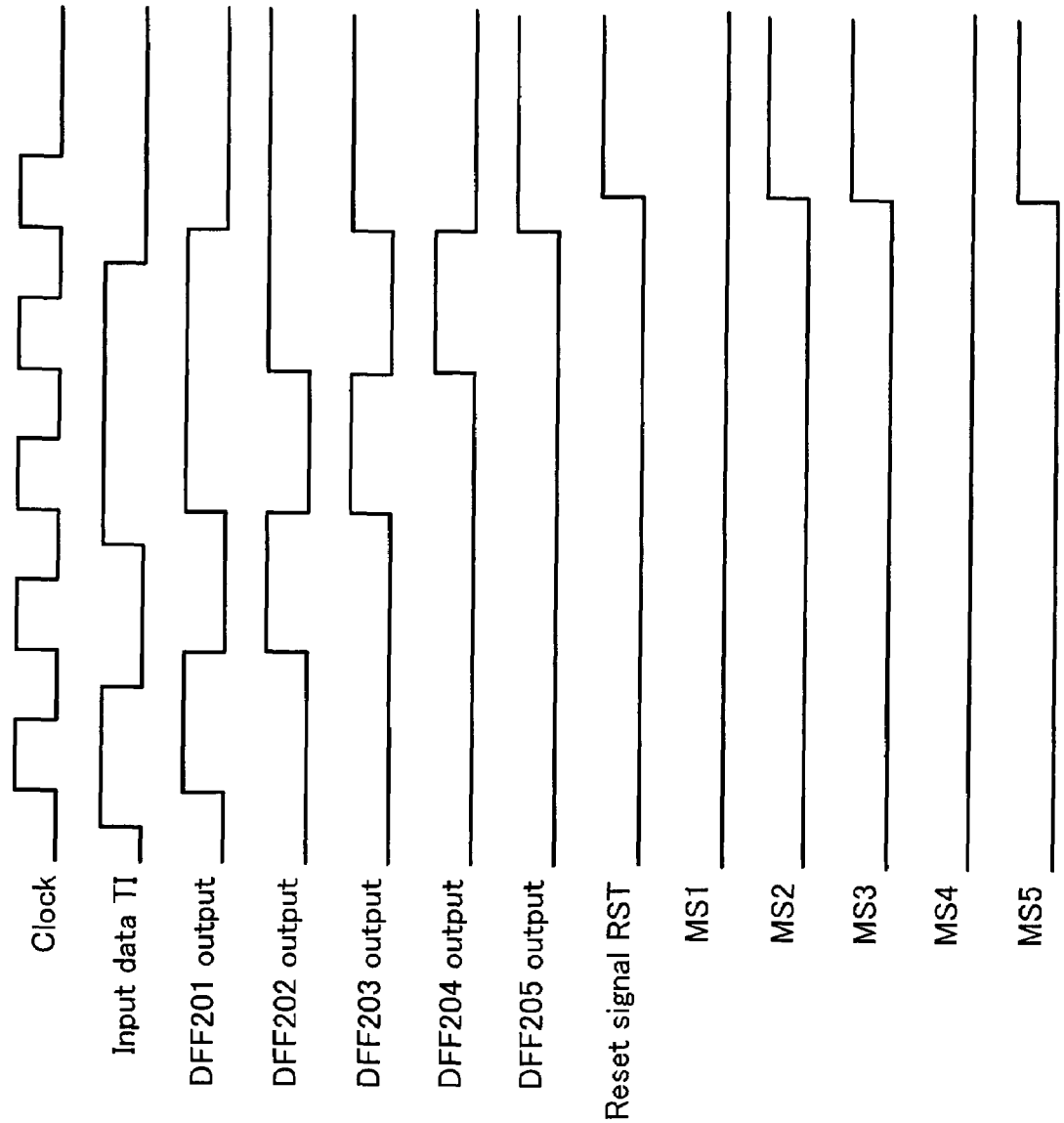
FIG. 3 is a timing chart of signals used in various portions.

Assume that the macros 105b, 105c and 105e are to be brought to the test operation state, for example. As shown in FIG. 3, while the reset signal RST is in a low (L) level, the selection control signal TI changing its level in the order of high, low, high, high, low (descending order) is inputted. The levels are sequentially shifted in synchronization with the rising of the clock signal and held in the D flipflops 201 to 205.

Once the reset signal RST becomes H level and the clock signal CLK is held at L level, the outputs of the D flipflops 201 to 205 are latched in the latches 206 to 210 and also outputted from the AND circuits 211 to 215 as the macro selection signals MS1 to MS5.

The macros 105b, 105c and 105e into which the H-level macro selection signals MS2, MS3 and MS5 are inputted are brought to the test operation state, to permit testing of the operation of these macros. If the testing is for the operation of the macro 105b and the like responding to an input signal inputted thereinto via a path not shown, for example, an input signal of test data for this testing will be supplied separately (via the same path as that used during normal operation). Also, the results of the test operation will be evaluated with a signal outputted from the macro 105b and the like via a path not shown, for example, in the same manner as that during normal operation or in a manner unique to the test operation.

As described above, by supplying the macro selection signals as a serial signal, reduction in the number of terminals and the number of pads provided in the semiconductor integrated circuit 100 and reduction in chip area can be easily attained. Moreover, even in the case of a plurality of macros operating simultaneously in actual use, for example, not limited to the situation of each macro operating singly, one macro or a plurality of macros can be brought to the operation state depending on the actual use. In this way, correct evaluation can be easily attained.

Although not especially limited, to control the timing of latching of the serial signal as described above, the control circuit 104 may use the same reset signal RST as that used during normal operation in the semiconductor integrated circuit 100. In this case, the number of terminals for control can be reduced. Moreover, since the testing can be started without especially considering the timing of reset during the testing, shortening of the test time can be easily attained.

It should be noted that various alterations are possible to the configuration of the serial-parallel conversion circuit, the number of bits, the latching sequence and the like. Also, the circuit elements such as the latches 206 to 210 may not necessarily be provided depending on the test operation timing and the like.

In order to allow the semiconductor integrated circuit 100 to perform normal operation, not the test operation, the D flipflops 201 to 205 and the latches 206 to 210 may be made to latch signals for selecting the macros 105a to 105c to be operated, like the signals described above. Alternatively, whether the operation is to be performed or not may be controlled by asserting a separately supplied normal operation control signal or negating a test operation signal, for example.

Embodiment 2

In performing the test operation as in Embodiment 1, signals outputted from the macro cells may be selectively asserted (outputted to another circuit in the semiconductor integrated circuit or outside).

Figure 4:
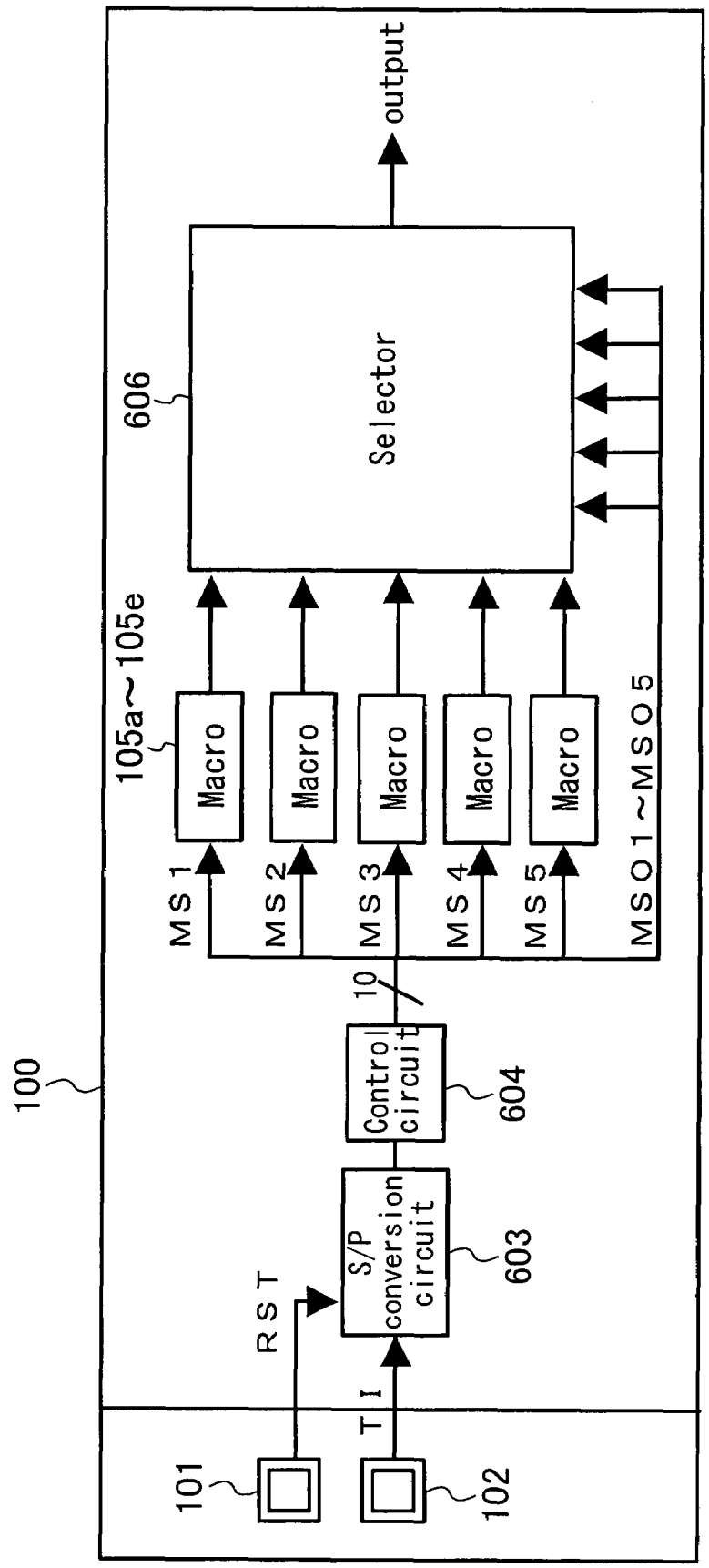
FIG. 4 is a block diagram of a main portion of a semiconductor integrated circuit of Embodiment 2.

More specifically, as shown in FIG. 4, for example, a semiconductor integrated circuit 100 of Embodiment 2 is different from that of Embodiment 1 in that a serial-parallel conversion circuit 603 and a control circuit 604 are provided in place of the serial-parallel conversion circuit 103 and the control circuit 104 and that a selector 606 is newly provided.

The serial-parallel conversion circuit 603 and the control circuit 604 are configured to serial-parallel convert 10-bit data, and while five bits (macro selection signals MS1 to MS5) among the output bits from the control circuit 604 are used for selection of the macros 105a to 105e as in Embodiment 1, the remaining five bits (output selection signals MS01 to MS05) are used for selection of the outputs of the macros 105a to 105e.

Figure 5:
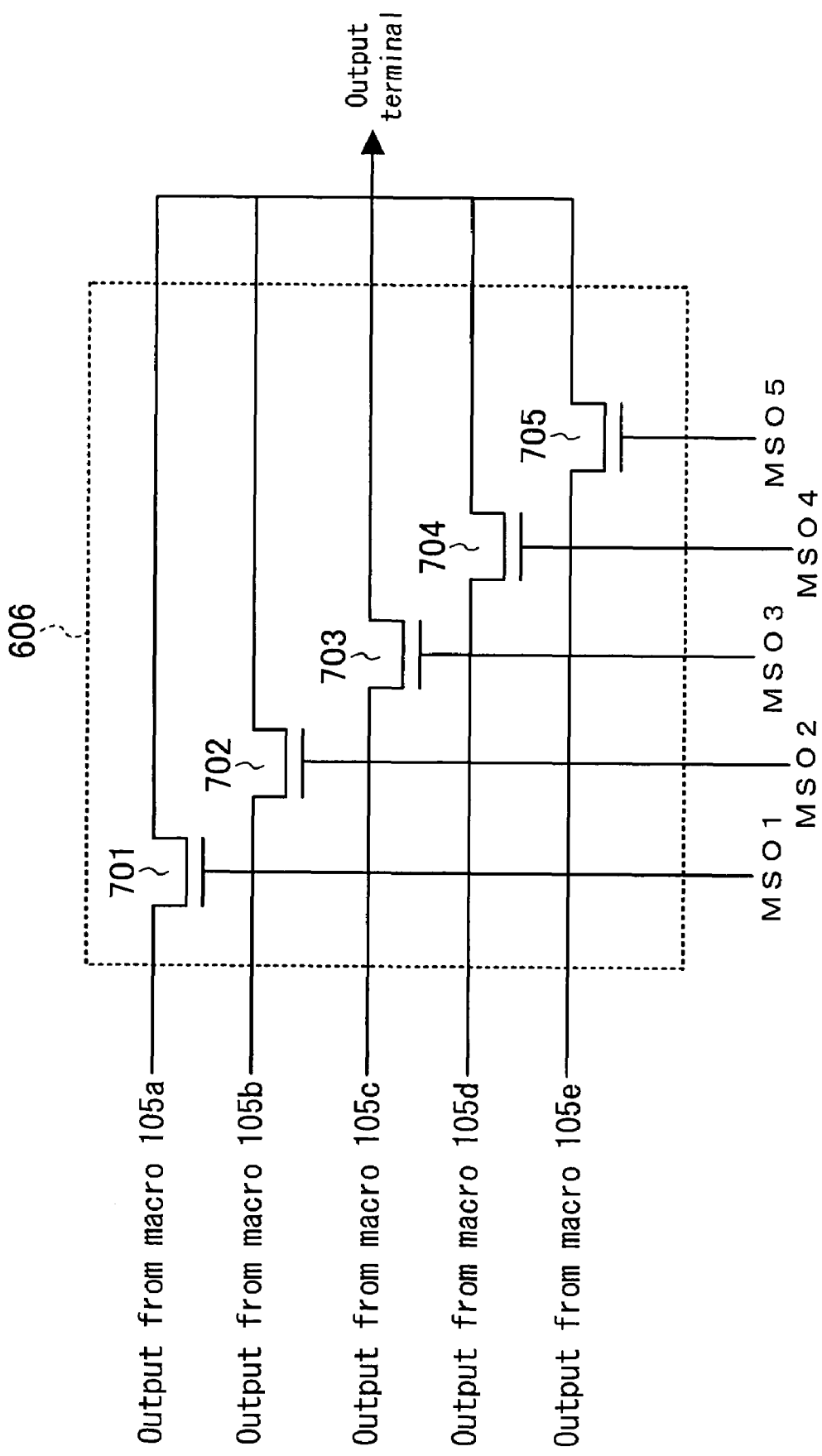
FIG. 5 is a circuit diagram showing a specific configuration of a selector 606 in Embodiment 2.

As specifically shown in FIG. 5, for example, the selector 606 includes N-channel transistors 701 to 705, so that the output of any one of the macros 105a to 105e is selected in response to the output selection signals MS01 to MS05, to connect the selected one to the output terminal or another circuit.

In the semiconductor integrated circuit 100 configured as described above, the selection of the macros 105a to 105e to be brought to the test operation state is made as in Embodiment 1. As for the output signals from the macros 105a to 105e, any one of them is connected to the output terminal via one of the N-channel transistors 701 to 705 that has become conductive based on the output selection signals MS01 to MS05. The outputted signal can be verified outside the semiconductor integrated circuit 100 to evaluate the test operation.

As described above, in addition to the selection of the macros 105a to 105e to be brought to the test operation state, the selection of the output signals is performed based on the control signal given as a serial signal. Thus, flexible testing can be easily attained while reducing the number of terminals as in Embodiment 1.

The number of signals outputted outside the semiconductor integrated circuit 100 is not limited to one, but a plurality of signals may be outputted by using a selector having a plurality of inputs/outputs in place of the selector 606.

The selected output signal is not necessarily outputted outside the semiconductor integrated circuit 100, but may be outputted to another circuit inside.

Embodiment 3

The serial-parallel converted selection signals may not be directly used for selection of the output signal, but decoded signals may be used for similar selection.

Figure 6:
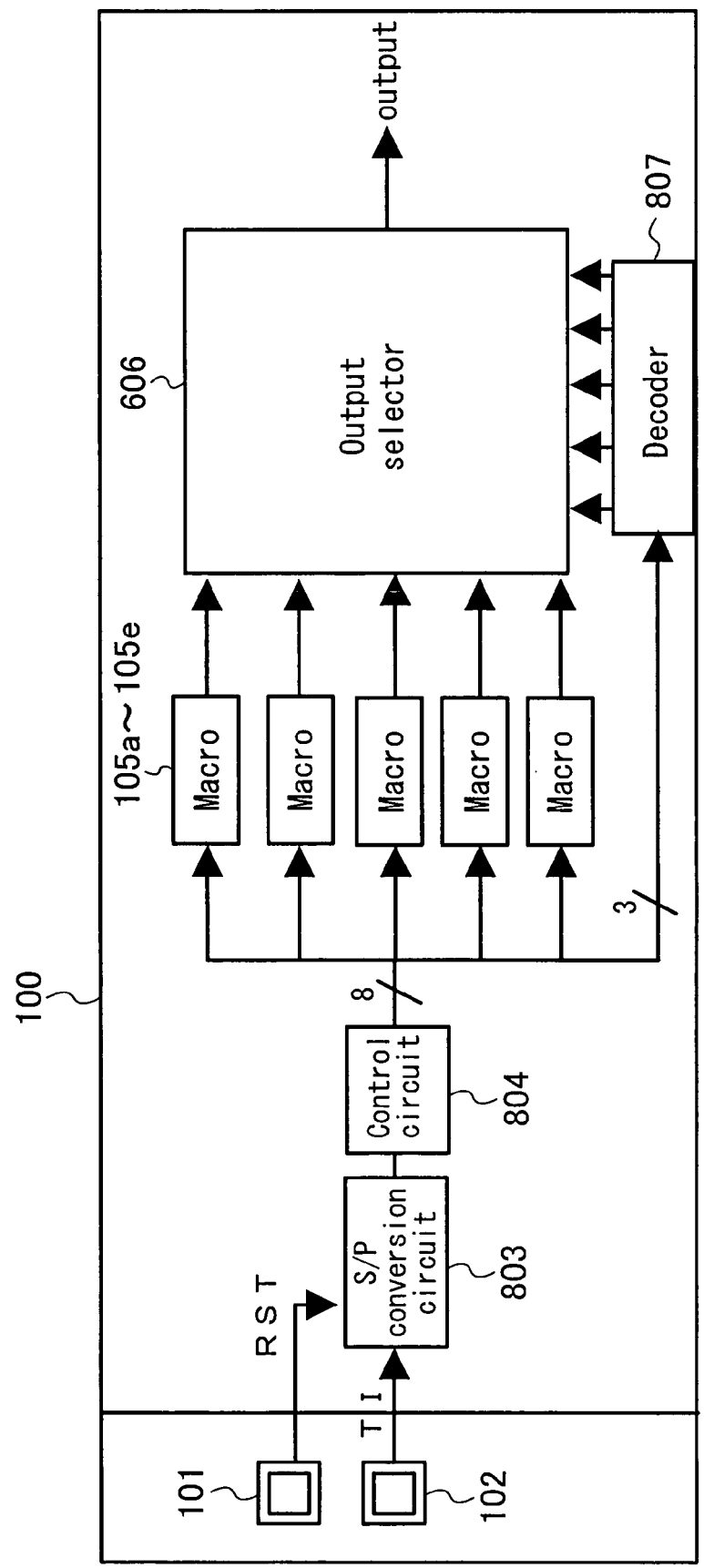
FIG. 6 is a block diagram of a main portion of a semiconductor integrated circuit of Embodiment 3.

More specifically, as shown in FIG. 6, for example, a semiconductor integrated circuit 100 of Embodiment 3 is different from that of Embodiment 2 in that a serial-parallel conversion circuit 803 and a control circuit 804 are provided in place of the serial-parallel conversion circuit 603 and the control circuit 604 and that a decoder 807 is newly provided.

The serial-parallel conversion circuit 803 and the control circuit 804 are configured to serial-parallel convert 8-bit data, and five bits (macro selection signals MS1 to MS5) among the output bits from the control circuit 804 are used for selection of the macros 105a to 105e as in Embodiments 1 and 2. The remaining three bits are decoded by the decoder 807, and resultantly generated output selection signals MS01 to MS05 are used for selection of the outputs of the macros 105a to 105e.

If only one is selected among the five output signals from the macros 105a to 105e, a total of five selection patterns are necessary and for this, the information amount of only three bits suffices. Therefore, by providing the decoder as described above, the number of bits of the inputted serial signal can be reduced, and thus the required input time and the hardware scale can be easily reduced.

Embodiment 4

As in the selection of the output signals in Embodiment 3, the selection of the macros 105a to 105e to be brought to the test operation state may also be performed based on decoded signals.

Figure 7:
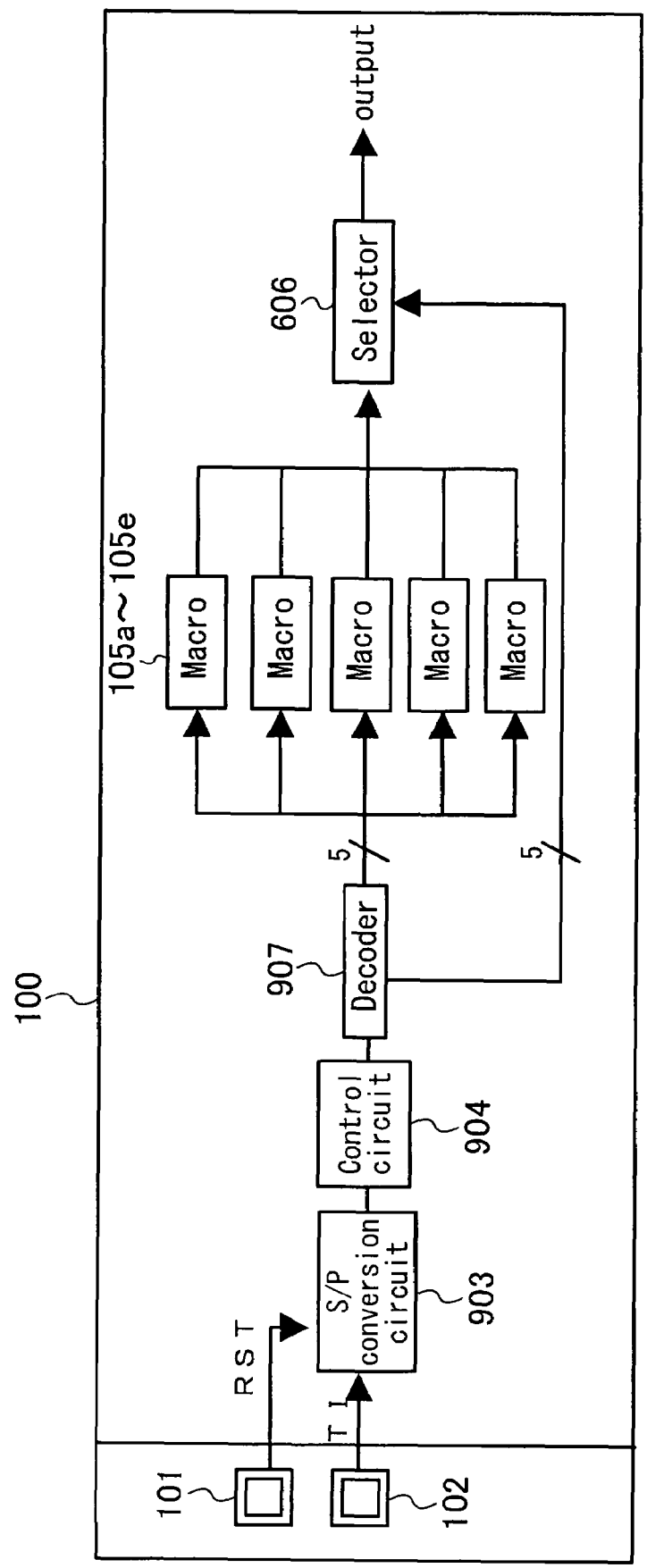
FIG. 7 is a block diagram of a main portion of a semiconductor integrated circuit of Embodiment 4.

More specifically, as shown in FIG. 7, for example, a semiconductor integrated circuit 100 of Embodiment 4 is different from that of Embodiment 3 in that a serial-parallel conversion circuit 903, a control circuit 904 and a decoder 907 are provided in place of the serial-parallel conversion circuit 803, the control circuit 804 and the decoder 807.

The serial-parallel conversion circuit 903 and the control circuit 904 convert the serial signal having the number of bits corresponding to the number of patterns of the macro selection signals MS1 to MS5 and the output selection signals MS01 to MS05 to parallel signals. The decoder 907 decodes the resultant signals and outputs each five bits of the macro and output selection signals.

With the decoding as described above, the number of bits of the inputted serial signal can be easily made smaller in such cases that the test patterns are narrowed down, like the case of performing only six kinds of tests including operation of each macro unit and simultaneous operation of all the macros, and that the use of the signals is limited to the combination of the macro selection and the output selection.

Note that the output selection signals may be directly inputted as a serial signal, and only the macro selection signals may be decoded and generated.

Embodiment 5

Figure 8:
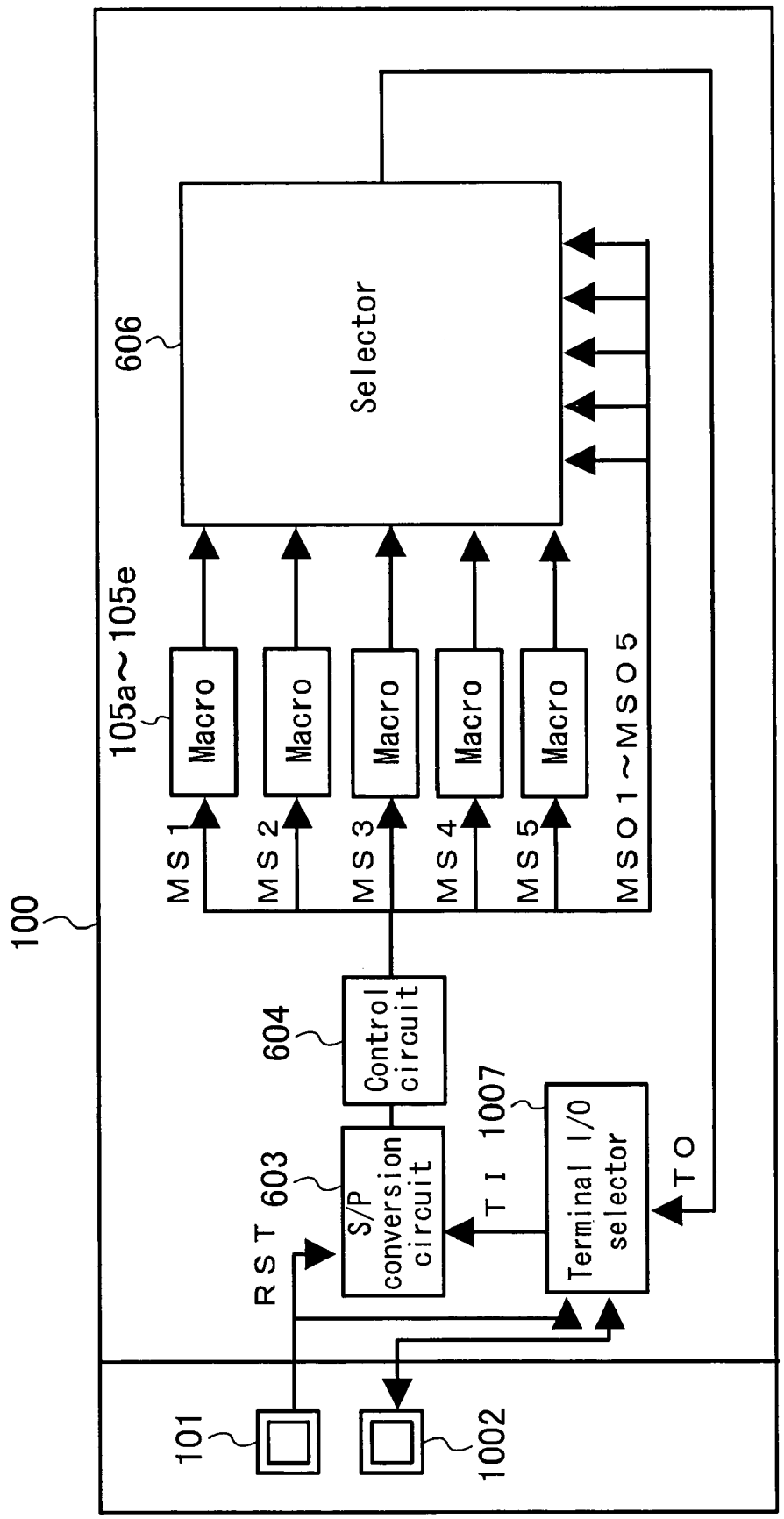
FIG. 8 is a block diagram of a main portion of a semiconductor integrated circuit of Embodiment 5.

As shown in FIG. 8, for example, a semiconductor integrated circuit 100 of Embodiment 5 is different from that of Embodiment 2 in that an external input/output (I/O) terminal 1002 is provided in place of the external input test terminal 102 and that a terminal input/output (I/O) selector 1007 is newly provided. The external I/O terminal 1002 is shared in input/output by routing both the input of the serial input signal and the output of the output signals from the macros via the terminal I/O selector 1007.

Figure 9:
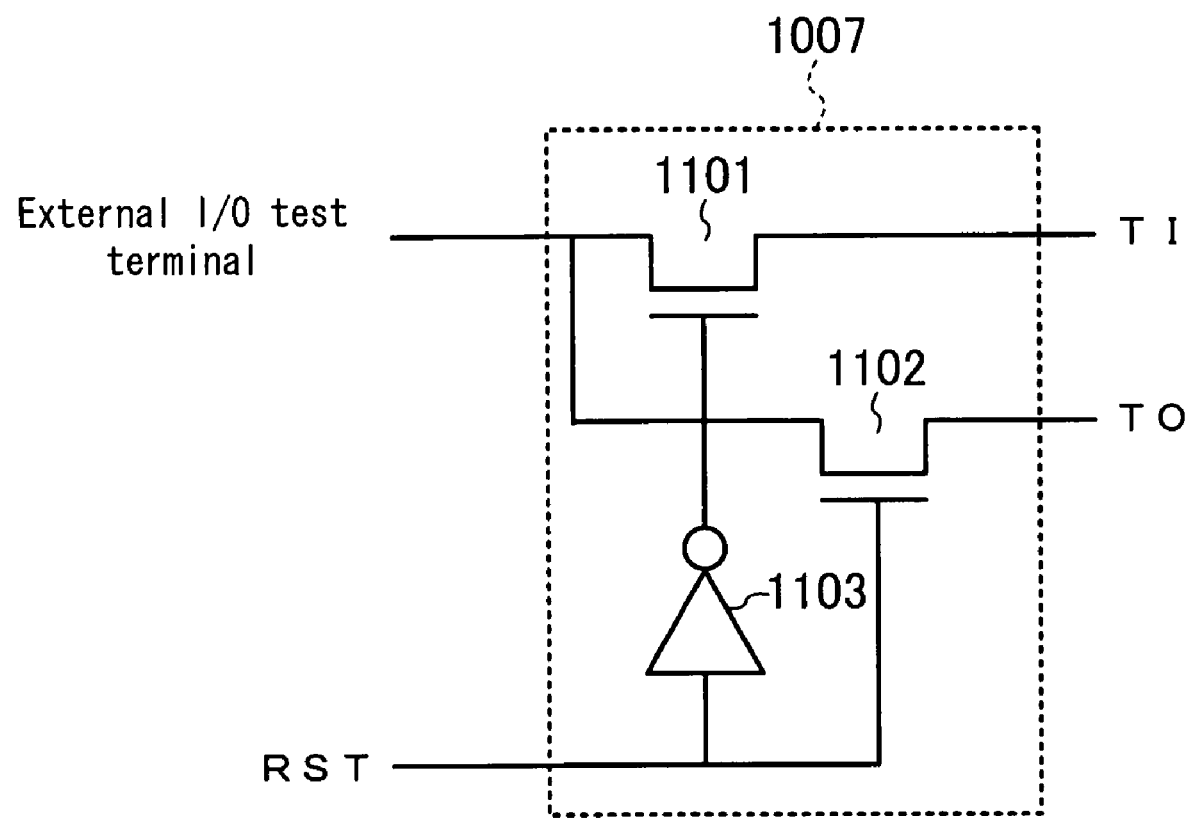
FIG. 9 is a circuit diagram showing a specific configuration of a selector 1007 in Embodiment 5.

As specifically shown in FIG. 9, for example, the terminal I/O selector 1007 includes N-channel transistors 1101 and 1102 and an inverter 1103. The terminal I/O selector 1007 outputs the serial signal received via the external I/O terminal 1002 to the serial-parallel conversion circuit 603 if the reset signal RST is in L level, and outputs the output signals from the macros 105a to 105e outside via the external I/O terminal 1002 if the reset signal RST is in H level, that is, during the test operation.

By sharing the external I/O terminal 1002 in input/output as described above, further reduction in the number of terminals can be easily attained.

Embodiment 6

Figure 10:
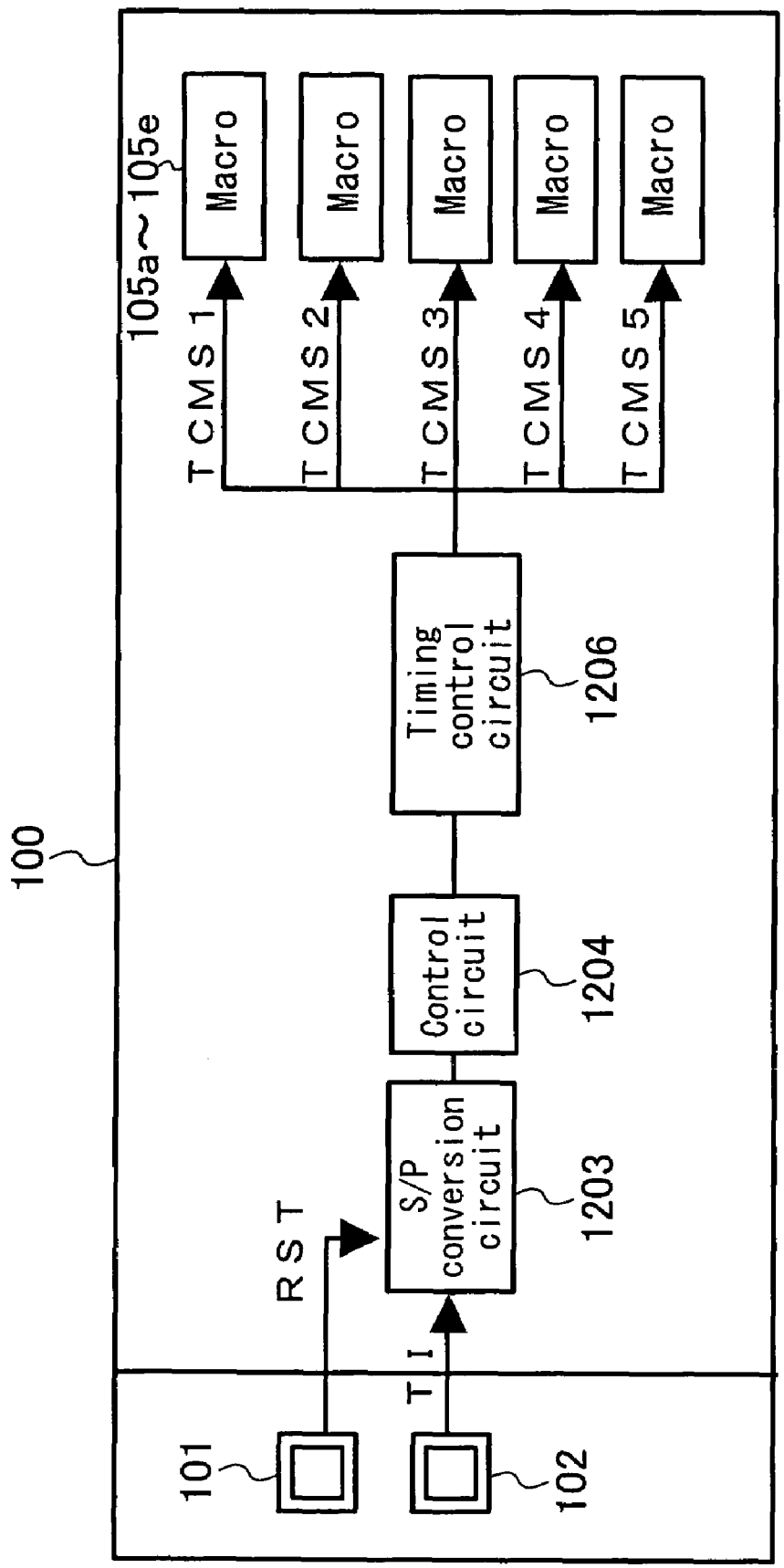
FIG. 10 is a block diagram of a main portion of a semiconductor integrated circuit of Embodiment 6.

As shown in FIG. 10, for example, a semiconductor integrated circuit 100 of Embodiment 6 is different from that of Embodiment 1 in that a serial-parallel conversion circuit 1203 and a control circuit 1204 are provided in place of the serial-parallel conversion circuit 103 and the control circuit 104 and that a timing control circuit 1206 is newly provided.

Figure 11:
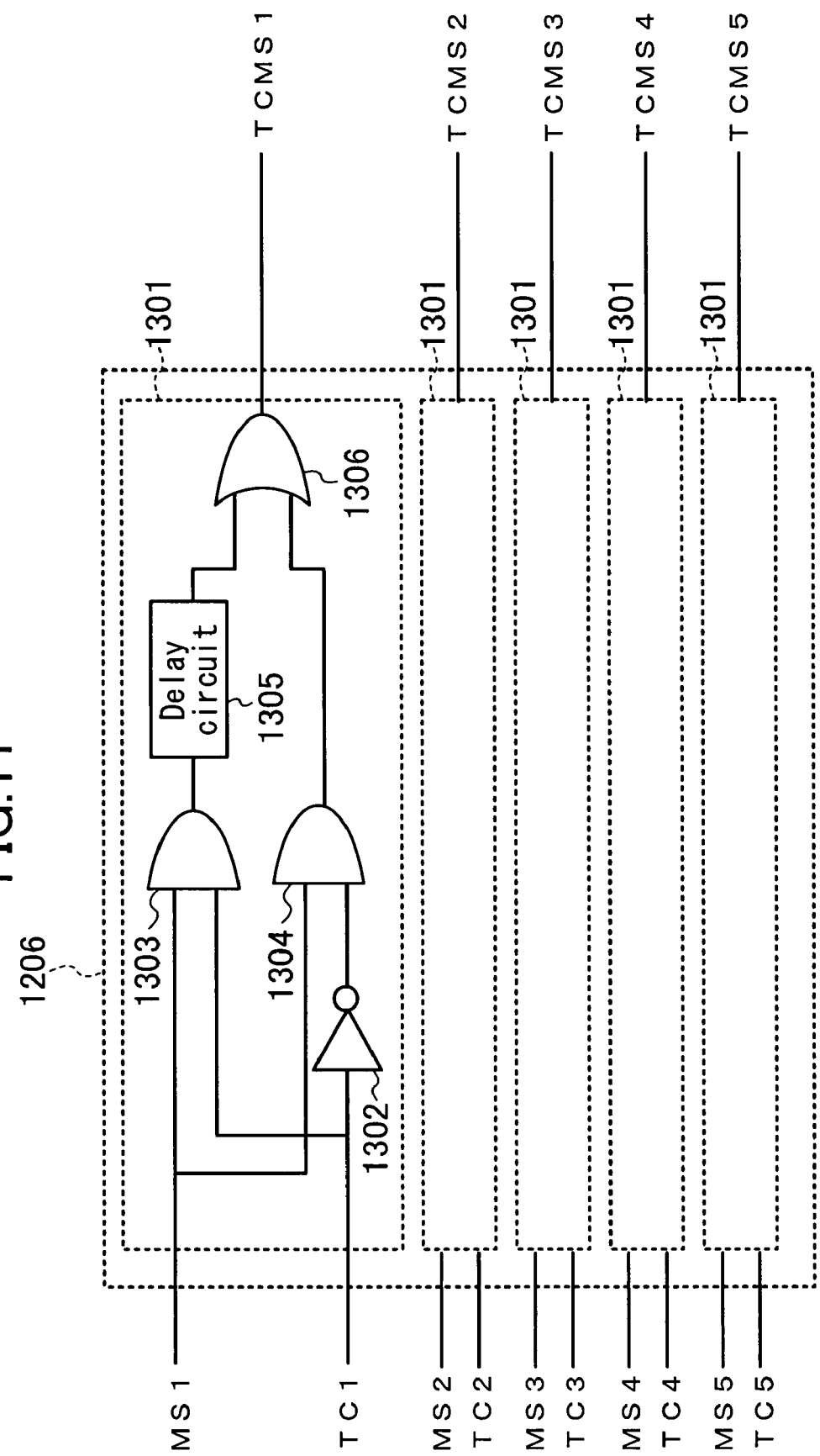
FIG. 11 is a circuit diagram showing a specific configuration of a timing control circuit 1206 in Embodiment 6.

As specifically shown in FIG. 11, for example, the timing control circuit 1206 includes timing control units 1301 corresponding to the macros 105a to 105e. Each of the timing control units 1301 includes an inverter 1302, AND circuits 1303 and 1304, a delay circuit 1305 and an OR circuit 1306. In the selection of the macros 105a to 105e, the timing control circuit 1206 outputs any of the macro selection signals MS1 to MS5 that is in H level as it is or after the lapse of a predetermined delay time as TCMS1 to TCMS5. The control on whether the signal is delayed or not is based on timing control signals TC1 to TC5 that are inputted as a serial signal prior to the serial selection control signal, converted to parallel signals and held in a holding portion not shown.

With the configuration as described above, assuming that the macro 105a is selected and subjected to operation testing, for example, the macro selection signal MS1 makes transition to H level at timing delayed by the delay circuit 1305 if the corresponding timing control signal TC1 is in H level. The macro 105a therefore starts the test operation behind the delay time. That is, the situation in which the macros 105a to 105e operate at the same timing as that used in actual use is replicated, and thus more accurate evaluation can be easily attained.

The delay time is not necessarily fixed. The delay time of the delay circuit may be varied or a plurality of types of delay circuits may be provided, to permit adjustment according to control signals given as a serial signal and the like as described above.

Embodiment 7

In place of the serial signal as described above, an analog signal may be used for selection of the macros and the like.

Figure 12:
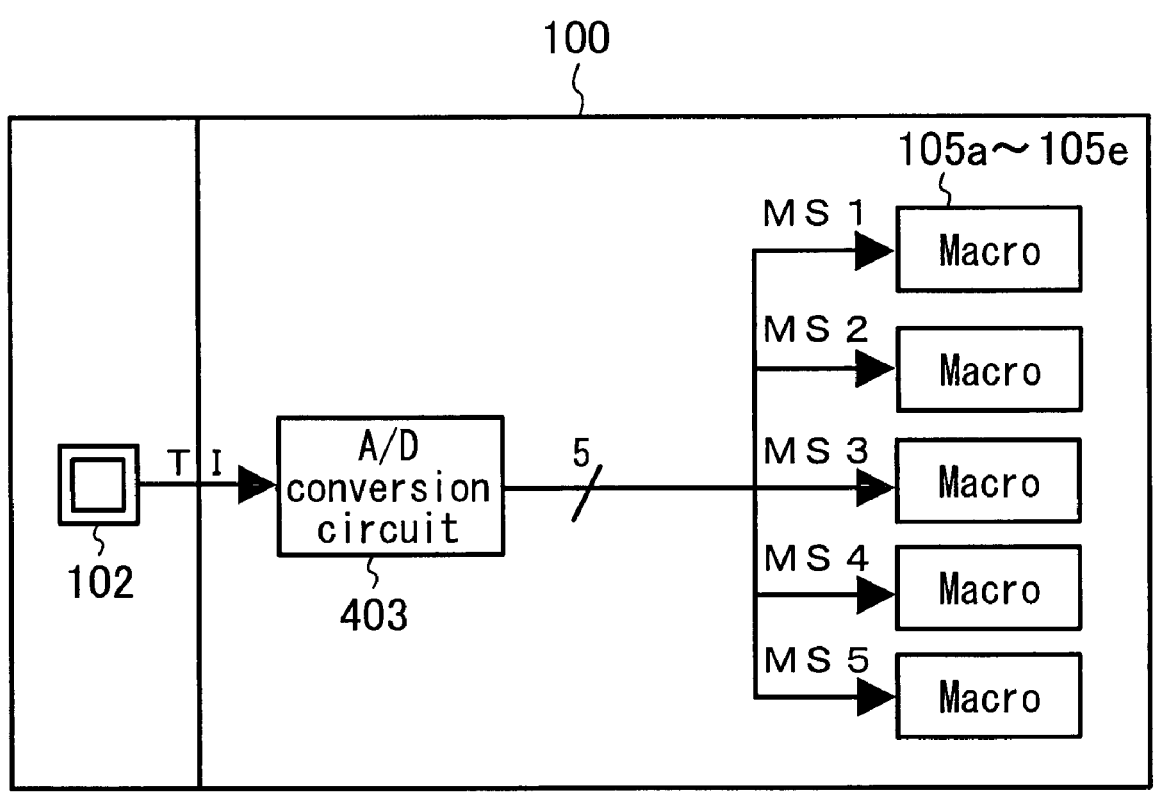
FIG. 12 is a block diagram of a main portion of a semiconductor integrated circuit of Embodiment 7.

As shown in FIG. 12, for example, a semiconductor integrated circuit 100 of Embodiment 7 includes an analog-digital (A/D) conversion circuit 403 and outputs the macro selection signals MS1 to MS5 as digital signals according to the voltage inputted via the test terminal 102.

Figure 13:
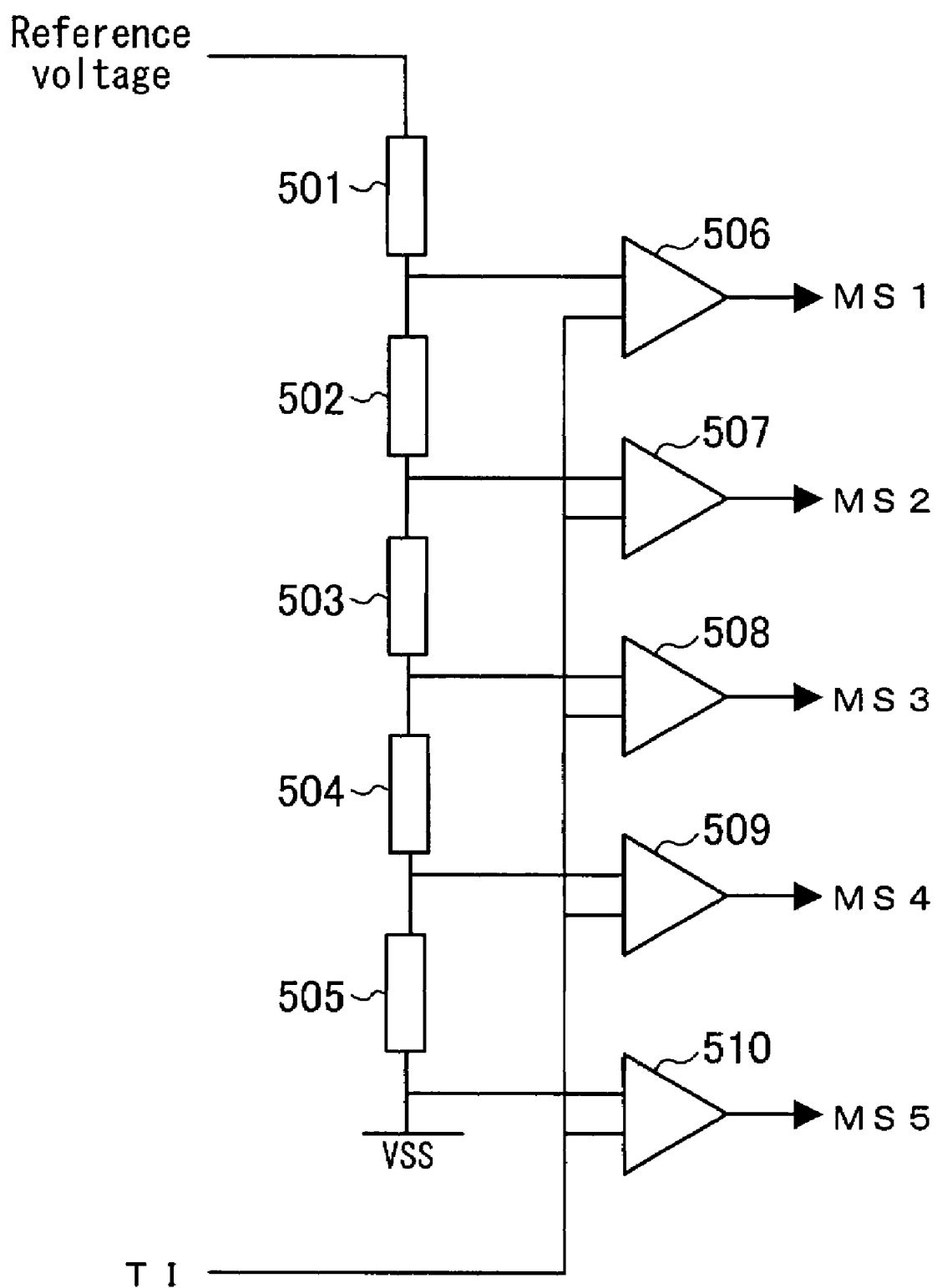
FIG. 13 is a circuit diagram showing a specific configuration of an analog-digital conversion circuit 403 in Embodiment 7.

As the A/D conversion circuit 403 described above, a circuit shown in FIG. 13, for example, may be used. In the A/D conversion circuit 403, reference voltages obtained by dividing the power supply voltage with resistances 501 to 505 and the voltage of an analog signal inputted via the test terminal 102 are compared to each other by comparison circuits 506 to 510, respectively. With this comparison, it is possible to turn only the macro selection signal MS1, for example, to H level, or turn all of the macro selection signals MS1 to MS5 to H level.

With the configuration as described above, with mere input of one analog signal of a predetermined voltage, the selection of the macros 105a to 105e can be controlled with A/D-converted signals. Thus, in this embodiment, also, reduction in the number of terminals can be easily attained.

The circuit scale can be made comparatively small by using the A/D conversion circuit 403 described above. The A/D conversion circuit is not limited to that described above, but various types of A/D conversion circuits may be used according to the number of combinations of selection patterns. For example, an A/D conversion circuit that outputs a 5-bit digital signal responding to 32 scales of voltage may be used to enable selection of any given combination of the macros 105a to 105e.

It should be noted that the components described in the above embodiments and alterations may be combined in various ways as far as such a combination is logically available. To state more specifically, the technique of controlling the start timing of the operation of the macros 105a to 105e as described in Embodiment 6, for example, may be applied to the configurations permitting the selection of the output signals as well as the selection of the macros, like those of Embodiments 2 to 5. Otherwise, the technique of A/D conversion as described in Embodiment 7 may be used for the selection of the output signals and the control of the operation start timing as in Embodiments 2 to 6.

As described above, in the semiconductor integrated circuit of the present invention, macro cells can be flexibly selected with a reduced number of terminals for testing and the like.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor integrated circuit comprising:
   a plurality of macro cells; and
   a serial-parallel conversion circuit for parallel-converting a serial signal inputted from outside to generate parallel selection control signals having N bits,
   wherein one or more among the plurality of macro cells are selected based on M bits out of the N bits of the selection control signals, and
   wherein $N>1$ and $M<N$; and
   the semiconductor integrated circuit further comprises a first decode circuit for decoding bits other than the M bits of the selection control signals, and a selector for selecting one of output signals from the plurality of macro cells based on the decoded result of the first decode circuit.

2. The semiconductor integrated circuit of claim 1, further comprising a second decode circuit for decoding the M bits out of the N bits of the selection control signals,
   wherein the selection of one or more among the plurality of macro cells is made based on the decoded result of the second decode circuit.

3. The semiconductor integrated circuit of claim 1, wherein the selected macro cell output signal is outputted outside the semiconductor integrated circuit.

4. The semiconductor integrated circuit of claim 3, wherein a same terminal is used as a terminal via which the serial signal and as a terminal via which the macro cell output signal is outputted outside the semiconductor integrated circuit.

5. The semiconductor integrated circuit of claim 1, wherein the M bits out of the N bits of the selection control signals include timing control information indicating operation timing for selected macro cells, and
   the timing for bringing the macro cells to the test operation state is controlled based on the timing control information.

6. The semiconductor integrated circuit of claim 1, wherein the serial signal or the analog signal is captured when a predetermined reset signal is in a first level, and
   macro cells corresponding to the M bits out of the N bits of the selection control signals are brought to the test operation state when the reset signal is in a second level.

7. The semiconductor integrated circuit of claim 1, wherein at least one of the plurality of macro cells constitutes a memory.

8. A semiconductor integrated circuit comprising:
   a plurality of macro cells; and
   an A/D conversion circuit for A/D-convening an analog signal inputted from outside to generate digital selection control signals having N bits,
   wherein one or more among the plurality of macro cells are selected based on M bits out of the N bits of the selection control signals, and
   wherein $N>1$ and $M<N$; and
   the semiconductor integrated circuit further comprises a first decode circuit for decoding bits other than the M bits out of the N bits of the selection control signals, and a selector for selecting one of output signal from the plurality of macro cells based on the decoded result of the first decode circuit.

* * * * *